(12) United States Patent
Lee

(10) Patent No.: US 10,109,655 B2
(45) Date of Patent: Oct. 23, 2018

(54) DISPLAY DEVICE WITH LIGHT-EMITTING DIODE IN CONCAVE

(71) Applicant: InnoLux Corporation, Miao-Li County (TW)

(72) Inventor: Kuan-Feng Lee, Miao-Li County (TW)

(73) Assignee: INNOLUX CORPORATION, Jhu-Nan, Miao-Li County (TW)

(*) Notice: Subject to any disclaimer, the term of this patent is extended or adjusted under 35 U.S.C. 154(b) by 18 days.

(21) Appl. No.: 15/611,835

(22) Filed: Jun. 2, 2017

(65) Prior Publication Data
US 2018/0006058 A1 Jan. 4, 2018

(30) Foreign Application Priority Data
Jun. 30, 2016 (CN) .......................... 2016 1 0506488

(51) Int. Cl.
*H01L 27/12* (2006.01)
*H01L 33/56* (2010.01)

(52) U.S. Cl.
CPC ............ *H01L 27/124* (2013.01); *H01L 33/56* (2013.01)

(58) Field of Classification Search
CPC ............... H01L 27/3276; H01L 27/124; H01L 27/1259
See application file for complete search history.

(56) References Cited

U.S. PATENT DOCUMENTS

| 6,624,572 B1* | 9/2003 | Kim ................. G06Q 40/02 313/500 |
| 9,082,997 B2* | 7/2015 | Baek ................. H01L 51/5203 |
| 2006/0017665 A1* | 1/2006 | Ko ..................... G09G 3/3233 345/76 |
| 2008/0128686 A1* | 6/2008 | Kwon ............... H01L 51/5218 257/40 |
| 2008/0197342 A1* | 8/2008 | Lee ................... H01L 27/3244 257/40 |
| 2009/0021154 A1* | 1/2009 | Aota ................. H01L 27/3258 313/504 |
| 2018/0006058 A1* | 1/2018 | Lee ..................... H01L 33/56 |

FOREIGN PATENT DOCUMENTS

KR  1020150123194  * 11/2015

* cited by examiner

*Primary Examiner* — Kyoung Lee
*Assistant Examiner* — Christina Sylvia
(74) *Attorney, Agent, or Firm* — McClure, Qualey & Rodack, LLP

(57) ABSTRACT

A display device is provided, which includes a substrate with a concave. A light-emitting diode is disposed in the concave. A thin film transistor is disposed on a surface of the substrate, and electrically connected to the light-emitting diode. The thin film transistor and the light-emitting diode are disposed on the same side of the substrate, or disposed on different sides of the substrate.

18 Claims, 12 Drawing Sheets ized to form a gate electrode 13g, an electrode 13a, and an electrode 13c. The conductive layer can comprise metal, transparent conductor, or another suitable conductive material. The substrate 11 can be a rigid substrate (ex. glass substrate) with a thickness of 300 to 500 micrometers (μm). Alternatively, the substrate 11 can be a flexible substrate, and the material of flexible substrate can comprise PI, PMMA, acrylate based material, PET, or other suitable flexible material. A gate insulation layer 15 is then formed on the gate electrode 13g, the electrodes 13a and 13c, and the substrate 11. The gate insulation layer 15 can comprise silicon oxide, silicon nitride, silicon oxynitride, another suitable insulation material, or a stack structure thereof. A semiconductor layer is then formed on the gate insulation layer 15, and then patterned by lithography, etching, and the like to define a semiconductor layer 17 corresponding to the gate electrode 13g. In this embodiment, the semiconductor layer 17 has a width that is less than that of the gate electrode 13g. However, the semiconductor layer 17 may (but is not limited to) have a width greater than or equal to that of the gate electrode 13g if necessary. In one embodiment, the semiconductor layer can comprise metal oxide semiconductor such as IGZO, polysilicon such as low temperature polysilicon (LTPS), or another suitable semiconductor material.

DISPLAY DEVICE WITH LIGHT-EMITTING DIODE IN CONCAVE

CROSS REFERENCE TO RELATED APPLICATIONS

This application claims priority of China Patent Application No. 201610506488.4, filed on Jun. 30, 2016, the entirety of which is incorporated by reference herein.

BACKGROUND

Technical Field

The disclosure relates to a display device, and in particular relates to the structure of a light-emitting diode and a thin film transistor thereof.

Description of the Related Art

Inorganic light-emitting diodes (LED) can be divided into two types: a flip-chip type and a vertical type, based on the positions of the electrodes. In a flip-chip type LED, an anode contact and a cathode contact are disposed on the same side of a light-emitting layer of the LED. In the vertical-type LED, an anode contact and a cathode contact are disposed on different sides of a light-emitting layer of the LED. Inorganic layers of the LED are stacked on a substrate, patterned by lithography and etching, and diced to form a plurality of individual LED chips. However, conventional LED chips have a thickness of 5 to 10 micrometers. If the LED chips are directly bonded to a thin film transistor (TFT) substrate, the top surface of the TFT substrate and the top surface of the LED chip will have a large distance therebetween. As such, the subsequent processes may apply non-uniform force to a device with such distance, thereby cracking or even breaking the device. On the other hand, lights of different colors emitted by the adjacent LED chips (directly bonded onto the surface of the TFT substrate without being separate from each other) are easily mixed to reduce the image quality.

Accordingly, a novel structure of integrating the LED and the TFT to improve production yield or reduce mixing-color problem is called for.

BRIEF SUMMARY

One embodiment of the disclosure provides a display device, comprising: a substrate with a concave; a light-emitting diode disposed in the concave; and a thin film transistor disposed on a surface of the substrate and electrically connected to the light-emitting diode.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1A:
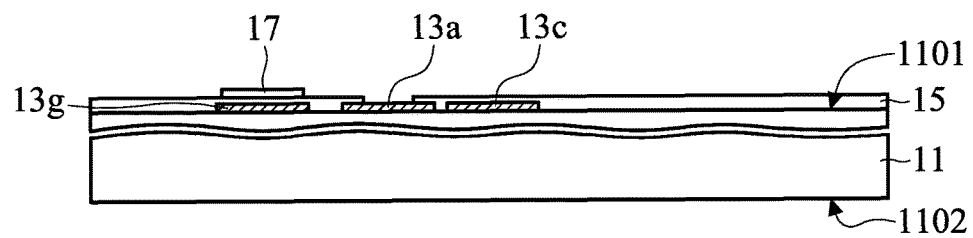
FIGS. 1A to 1H show cross-sectional views of manufacturing a display device in one embodiment.

FIGS. 1A to 1H show cross-sectional views of manufacturing a display device in one embodiment. In FIG. 1A, a conductive layer is formed on a top surface 1101 of the substrate 11, and then patterned by lithography, etching, and the like to define a gate electrode 13g, an electrode 13a, and an electrode 13c. The conductive layer can comprise metal, transparent conductor, or another suitable conductive material. The substrate 11 can be a rigid substrate (ex. glass substrate) with a thickness of 300 to 500 micrometers (μm). Alternatively, the substrate 11 can be a flexible substrate, and the material of flexible substrate can comprise PI, PMMA, acrylate based material, PET, or other suitable flexible material. A gate insulation layer 15 is then formed on the gate electrode 13g, the electrodes 13a and 13c, and the substrate 11. The gate insulation layer 15 can comprise silicon oxide, silicon nitride, silicon oxynitride, another suitable insulation material, or a stack structure thereof. A semiconductor layer is then formed on the gate insulation layer 15, and then patterned by lithography, etching, and the like to define a semiconductor layer 17 corresponding to the gate electrode 13g. In this embodiment, the semiconductor layer 17 has a width that is less than that of the gate electrode 13g. However, the semiconductor layer 17 may (but is not limited to) have a width greater than or equal to that of the gate electrode 13g if necessary. In one embodiment, the semiconductor layer can comprise metal oxide semiconductor such as IGZO, polysilicon such as low temperature polysilicon (LTPS), or another suitable semiconductor material.

Figure 1B:
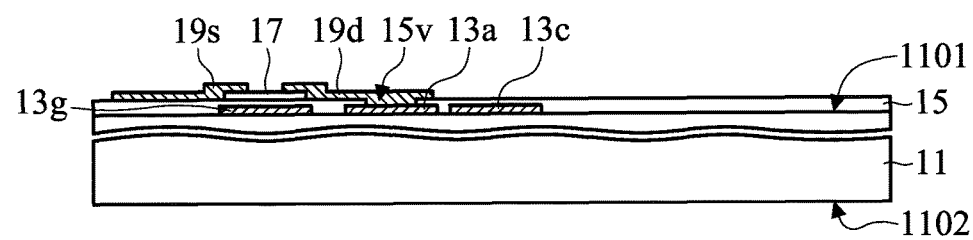

As shown in FIG. 1B, a via hole 15v is formed by lithography, etching, and the like to expose a part of the electrode 13a. A conductive layer is then formed on the gate insulation layer 15 and the semiconductor layer 17. A part of the conductive layer is disposed in the via hole 15v. The conductive layer is then patterned by lithography, etching, and the like to define a source electrode 19s and a drain electrode 19d respectively contacting two sides of the semiconductor layer 17. The drain electrode 19d contacts the electrode 13a through the via hole 15v. In one embodiment, the conductive layer can comprise metal or another suitable conductive material, but is not limited thereto. A major structure of a thin film transistor is therefore completed, which includes the semiconductor layer 17, the source electrode 19s, the drain electrode 19d, and the gate electrode 13g. In this embodiment, the gate electrode 13g is disposed between the semiconductor layer 17 and the substrate 11, and it is the so-called bottom gate structure.

Figure 1C:
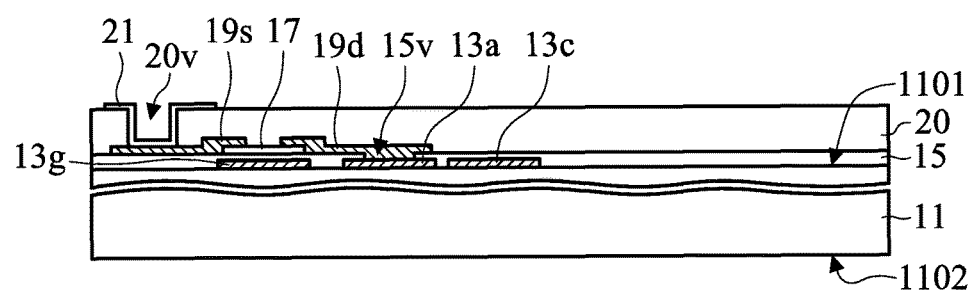

As shown in FIG. 1C, a protection layer 20 is then formed on the source electrode 19s, the drain electrode 19d, the semiconductor layer 17, and the gate insulation layer 15. In one embodiment, the protection layer 20 can comprise silicon oxide, silicon nitride, silicon oxynitride, another suitable insulation material, or a stack structure thereof. Subsequently, a via hole 20v is formed by lithography, etching, and the like to expose a part of the source electrode 19s. A conductive layer 21 is then formed in the via hole 20v and on the surface of the protection layer 20. The conductive layer 21 is then patterned by lithography, etching, and the like to be kept in the via hole 20v and extending onto a part of the protection layer 20. In one embodiment, the conductive layer 21 can comprise indium tin oxide (ITO), indium zinc oxide (IZO), treated conductive indium gallium zinc oxide (IGZO), metal, or another suitable conductive material.

Figure 1D:
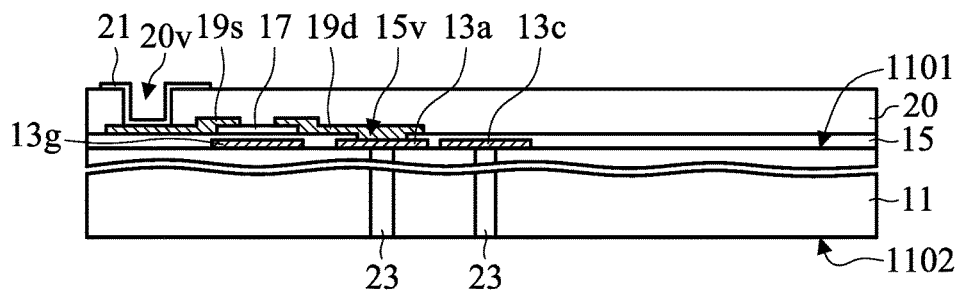

As shown in FIG. 1D, through holes 23 are formed by lithography and etching, mechanical drill, laser drill, or another process to penetrate through the substrate 11 and expose parts of the electrodes 13a and 13c. Thereafter, a conductive material is disposed into the through holes 23. Alternatively, the through holes 23 can be formed before the step of forming the gate electrode 13g and the electrodes 13a and 13c.

Figure 1E:
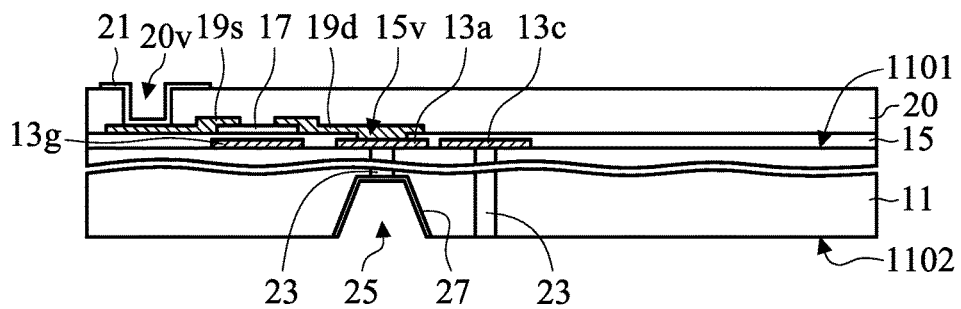

As shown in FIG. 1E, a concave 25 is defined in the substrate 11 by lithography, etching, and the like. As such, a part of the substrate 11 is recessed (removed). The surface of the recessed part doesn't belong to the bottom surface 1102 but belongs to the surface of the concave. A width of the concave 25 closing to the bottom surface 1102 of the substrate 11 is greater than a width of the concave 25 closing to the top surface 1101 of the substrate 11. The concave 25 corresponds to the electrode 13a, and they are electrically connected by the through hole 23. In general, the depth of the concave 25 may accommodate most of the volume of the LED (see the following description), so that the LED can be appropriately confined in the concave 25. As such, the problem of cracking or even breaking the device (due to subsequent processes applying non-uniform force on the device) can be mitigated. Alternatively, the depth of the concave 25 is substantially similar to the height of the LED (see the following description). A conductive layer is then formed in the concave 25 and on the bottom surface 1102 of the substrate 11, and then patterned by lithography, etching, and the like to define a conductive layer 27 kept on at least a portion of the surface of the concave 25. In one embodiment, the conductive layer 27 comprises a reflective material, such as metal or other reflective material or coating material. In one embodiment, a surface of the conductive layer 27 can be further treated to have a micro-structure pattern to enhance its reflective effect. In some embodiments, the conductive layer 27 can be kept on the through hole 23 (electrically connected to the electrode 13c) to serve as a contact (not shown).

Figure 1F:
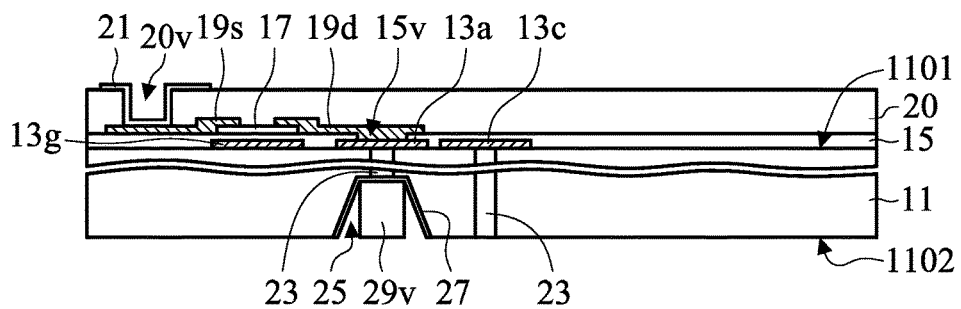

As shown in FIG. 1F, a LED 29v is electrically connected to the conductive layer 27 in the concave 25. The LED 29v can be a GaAs-based LED before packaging, and its P electrode and N electrode are respectively disposed on top and bottom sides of the LED body. In one embodiment, the LED 29v has a height of 5 µm to 10 µm. As described above, the depth of the concave 25 may accommodate most of the volume of the LED 29v. Because the LED 29v can be appropriately confined in the concave 25, the problem of cracking or even breaking the device (due to subsequent processes applying non-uniform force on the device) can be mitigated. In another embodiment, the depth of the concave 25 is substantially similar to the height of the LED 29v. In one embodiment, the depth of the concave 25 and the height of the LED 29v have a difference of less than 100 nm. If the above difference is too much, the LED 29v may protrude over or sink under the substrate surface, and subsequent processes may apply non-uniform force to the device that will crack or even break the device. On the other hand, the concave 25 accommodates most of the volume of the LED 29v, so that the light-emitting layer of the LED is disposed in the concave 25, and the side-light from the light-emitting layer may face the conductive layer 27 and then be reflected by the conductive layer 27. The total light-emitting angle can be modified to be perpendicular to the bottom surface 1102 of the substrate by designing the pattern of the conductive layer 27 and the light-emitting angle of the reflected side-light. Therefore, the problem of mixing light of the adjacent LEDs can be mitigated or eliminated.

Figure 1G:
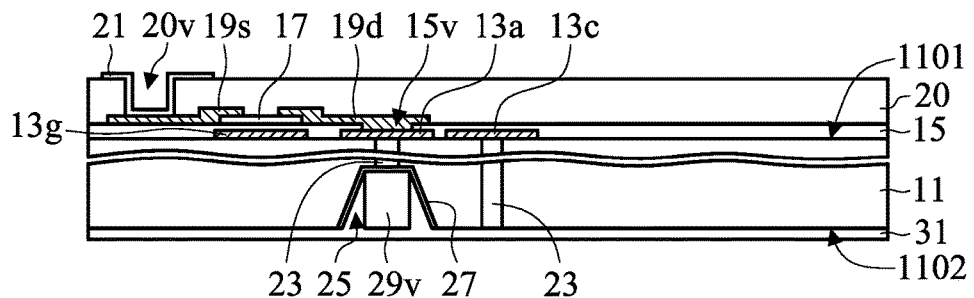

As shown in FIG. 1G, a protection layer 31 is disposed into the concave 25 and covers the LED 29v and the substrate 11. In one embodiment, the protection layer 31 can comprises organic material, inorganic material, or organic-inorganic composite material. The protection layer 31 can be a multi-layered structure.

Figure 1H:
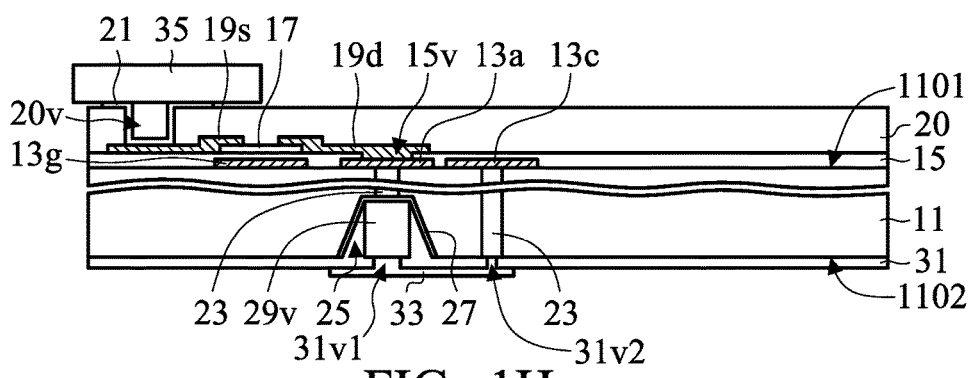

As shown in FIG. 1H, via holes 31v1 and 31v2 are formed by lithography, etching, and the like to expose a part of the LED 29v and a part of the through hole 23 connecting to the electrode 13c. A conductive layer 33 is then formed in the via holes 31v1 and 31v2 and on a surface of the protection layer 31. The conductive layer 33 is then patterned by lithography, etching, and the like. In one embodiment, the conductive layer 33 can comprise ITO, IZO, treated conductive IGZO, metal, or another suitable conductive material. In FIG. 1H, the electrode 13c is connected to the bottom side of the LED 29v through the through hole 23 and the conductive layer 33. The electrode 13a is connected to the top side of the LED 29v through the other through hole 23 and the conductive layer 27. Subsequently, an external circuit 35 such as a printed circuit board (PCB), a chip on film (COF), or an integrated circuit (IC) is electrically connected to the conductive layer 21. The external circuit 35 may control and drive the LED 29v.

In another embodiment, the conductive layer 21 and the corresponding via hole can be omitted, in which another through hole (not shown) can be formed to penetrate through the substrate 11, the protection layer 31, and the gate insulation layer 15 for exposing the source electrode 19s from the bottom side. In addition, the step of forming the conductive layer 33 also forms the conductive layer 33 in the through hole, thereby forming a contact on the protection layer 31. Therefore, the external circuit 35 is electrically connected to the contact on the bottom side of the substrate, and electrically connected to the source electrode 19s through the through hole (not shown).

In FIGS. 1A to 1H, the LED 29v is disposed in the concave of the substrate 11. The TFT with a bottom gate structure and the LED 29v on two sides of the substrate 11 are electrically connected through the through holes 23. The above design is also suitable for a TFT with a top gate structure. In following embodiments, the elements having numerals that are similar to that of the described elements can be composed of similar materials and formed by similar methods of the described elements, and the details of the composition and the manufactures of the elements will be omitted.

Figure 2:
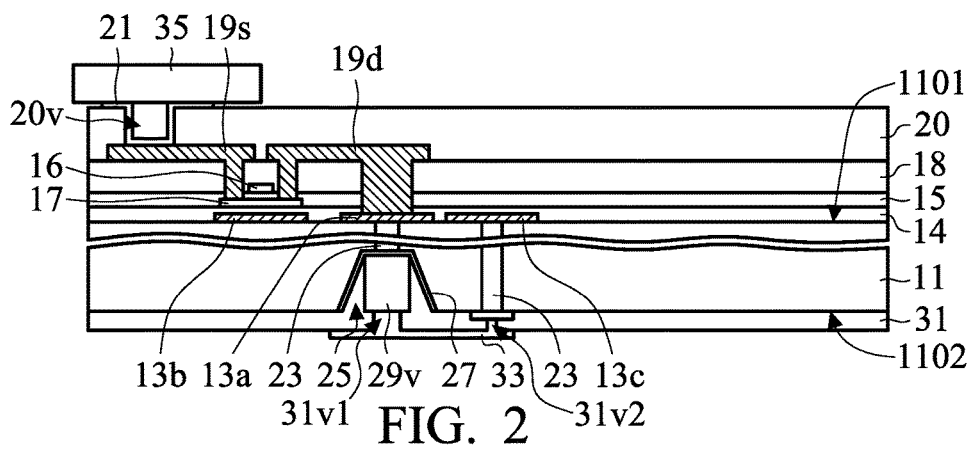
FIG. 2 shows a cross-sectional view of a display device.

FIG. 2 shows a cross-sectional view of a display device in one embodiment. In one embodiment, a light-shielding layer 13b and electrodes 13a and 13c are formed on a substrate 11. The light-shielding layer 13b and the electrodes 13a and 13c can comprise metal material. A buffer layer 14 is then formed on the light-shielding layer 13b, the electrodes 13a and 13c, and the substrate 11. In one embodiment, the buffer layer 14 can be an inorganic insulation layer such as silicon nitride, silicon oxide, silicon oxynitrde, or another suitable insulation material or a stack structure thereof. A semiconductor layer 17 is then formed on the buffer layer 14 to correspond to the light-shielding layer 13b, and a gate insulation layer 15 is then formed on the semiconductor layer 17 and the buffer layer 14. The light-shielding layer 13b can comprise Mo, Cr, W, or a related alloy material. The light-shielding layer 13b can comprise a highly thermal resistant metal material.

A gate electrode 16 is disposed on the gate insulation layer 15 to correspond the semiconductor layer 17. In one embodiment, the gate electrode 16 can comprise metal material. An insulation layer 18 us disposed on the gate insulation layer 15 and the gate electrode 16. In one embodiment, the insulation layer 18 can comprise silicon oxide, silicon nitride, silicon oxynitride, another suitable insulation material, or a stack structure thereof. Via holes are formed through the insulation layer 18, the gate insulation layer 15, and the buffer layer 14 by lithography, etching, and the like to expose two sides of the semiconductor layer 17 and the electrode 13a. A conductor is then disposed into the via holes and layered on the insulation layer 18, and then patterned by lithography, etching, and the like to define a source electrode 19s and a drain electrode 19d. The source electrode 19s contacts one side of the semiconductor layer 17 through the via hole, and the via hole penetrating through the insulation layer 18 and the gate insulation layer 15 can be constructed as a part of the source electrode. The drain electrode 19d contacts another side of the semiconductor layer 17 through the other via hole, and the other via hole penetrating through the insulation layer 18 and the gate insulation layer 15 can be constructed as a part of the drain electrode. The drain electrode 19d contacts the electrode 13a through the via hole penetrating through the insulation layer 18, the gate insulation layer 15, and the buffer layer 14. A major structure of a TFT with a top gate structure is therefore completed. The other elements such as the conductive layer 21, the external circuit 35, the through holes 23, the concave 25, and the LED 29v are similar to those in previous embodiment, and the related descriptions are omitted here.

Similarly, the through holes 23 can be formed in the substrate 11, and the other processes are then performed to complete the structure in FIG. 2. This embodiment may also omit the conductive layer 21 and the corresponding via hole, in which the external circuit 35 at the bottom side of the substrate 11 is electrically connected to the source electrode 19s through a through hole (not shown) penetrating the protection layer 31, the substrate 11, and the gate insulation layer 15. In this embodiment, the depth of the concave 25 may accommodate most of the volume of the LED 29v. Because the LED 29v can be appropriately confined in the concave 25, the problem of cracking or even breaking the device (due to subsequent processes applying non-uniform force on the device) can be mitigated. In another embodiment, the depth of the concave 25 is substantially similar to the height of the LED 29v. In one embodiment, the depth of the concave 25 and the height of the LED 29v have a difference of less than 100 nm, so that the problem of cracking or even breaking the device (due to subsequent processes applying non-uniform force on the device) can be mitigated. On the other hand, the concave 25 accommodates most of the volume of the LED 29v, so that the light-emitting layer of the LED is disposed in the concave 25, and the side-light from the light-emitting layer may face the conductive layer 27 and then be reflected by the conductive layer 27. The total light-emitting angle can be modified to be perpendicular to the bottom surface 1102 of the substrate by designing the pattern of the conductive layer 27 and the light-emitting angle of the reflected side-light. Therefore, the problem of mixing light of the adjacent LEDs can be mitigated or eliminated.

Figure 3A:
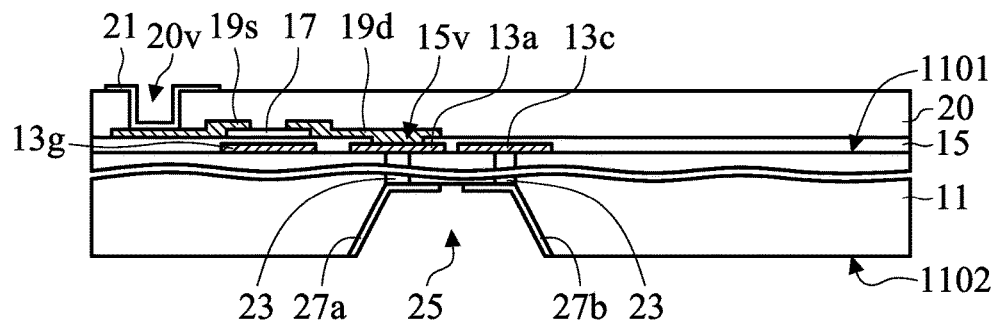
FIG. 3A to 3C show cross-sectional views of manufacturing a display device in one embodiment.
Figure 3B:
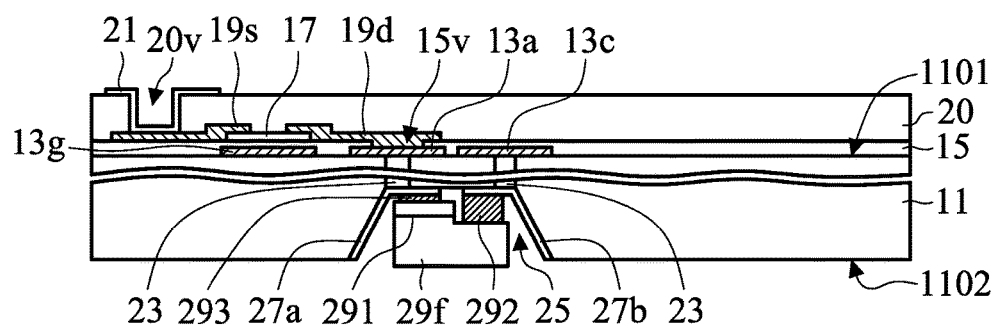
Figure 3C:
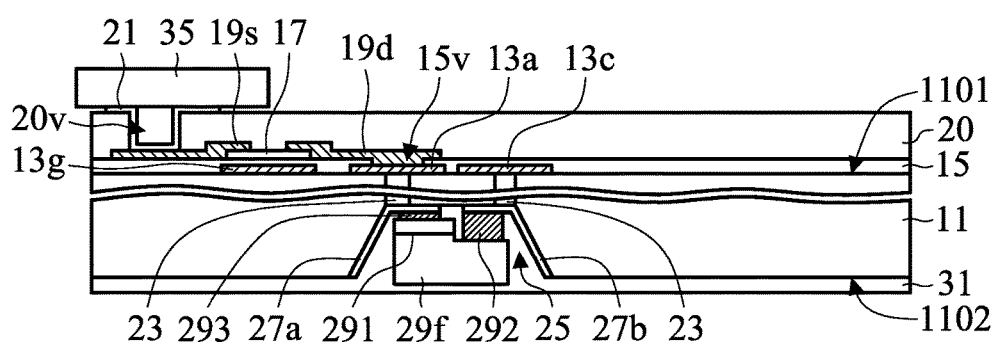

The LED 29v in FIGS. 1A to 1H is the vertical-type LED, however, it can be replaced by a flip-chip type or other type LED by just changing the electrode positions. FIGS. 3A to 3C show cross-sectional views of manufacturing a display device in one embodiment. FIG. 3A is continued from FIG. 1D, in which a concave 25 is formed to correspond to the electrodes 13a and 13c. Subsequently, separated conductive layers 27a and 27b are formed on the surface of the concave 25 to respectively contact the via holes 23 corresponding to the electrodes 13a and 13c. The conductive layers 27a and 27b are composed of a material similar to that of the described conductive layer 27. As shown in FIG. 3B, an anode contact and a cathode contact on the same side of a LED 29f are then respectively electrically connected to the conductive layers 27a and 27b. The structure of the LED 29f can be referred to a GaN-based LED before packaging, which includes a light emitting layer 291 and electrodes 292 and 293. The electrodes 292 and 293 may respectively serve as the cathode contact and the anode contact of the LED. In one embodiment, the LED 29f has a height of 5 µm to 10 µm. As shown in FIG. 3C, a protection layer 31 is disposed into the concave 25 and covers the LED 29f and the substrate 11. An external circuit 35 is then electrically connected to the conductive layer 21.

Similarly, the through holes 23 can be formed in the substrate 11, and the other processes are then performed to complete the structure in FIG. 3C. This embodiment may also omit the conductive layer 21 and the corresponding via hole, in which the external circuit 35 at the bottom side of the substrate 11 is electrically connected to the source electrode 19s through a through hole (not shown) penetrating the protection layer 31, the substrate 11, and the gate insulation layer 15. In this embodiment, the depth of the concave 25 may accommodate most of the volume of the LED 29f. Because the LED 29f can be appropriately confined in the concave 25, the problem of cracking or even breaking the device (due to subsequent processes applying non-uniform force on the device) can be mitigated. In another embodiment, the depth of the concave 25 is substantially similar to the height of the LED 29f (with a difference substantially less than 100 nm), so that the problem of cracking or even breaking the device (due to subsequent processes applying non-uniform force on the device) can be mitigated. On the other hand, the concave 25 accommodates most of the volume of the LED 29f, so that the light-emitting layer of the LED is disposed in the concave 25, and the side-light from the light-emitting layer may face the conductive layers 27a and 27b and then be reflected by the conductive layers 27a and 27b. The total light-emitting angle can be modified to be perpendicular to the bottom surface 1102 of the substrate by designing the pattern of the conductive layers 27a and 27b and the light-emitting angle of the reflected side-light. Therefore, the problem of mixing light of the adjacent LEDs can be mitigated or eliminated. In addition, the TFT with the bottom gate structure in FIGS. 3A to 3C can be replaced by the TFT with the top gate structure in FIG. 2.

Figure 4A:
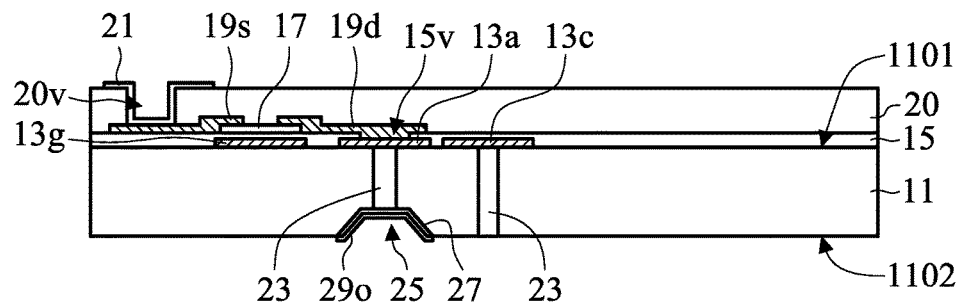
FIG. 4A to 4B show cross-sectional views of manufacturing a display device in one embodiment.
Figure 4B:
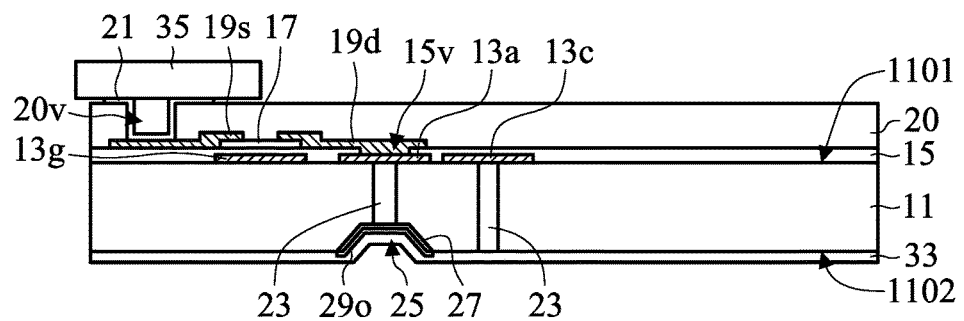

The LEDs in FIGS. 1A to 1H and 3A to 3C are inorganic LEDs, however, they can be replaced by an organic LED (OLED) or a quantum dot display element (QLED). FIGS. 4A to 4B show cross-sectional views of manufacturing a display device in one embodiment. FIG. 4A is continued from FIG. 1E, in which an OLED 290 is formed on the conductive layer 27 corresponding to the concave 25. As shown in FIG. 4B, a conductive layer 33 is then formed to dispose on the substrate 11 and the OLED 29O is in the concave 25. In one embodiment, the conductive layer 33 is a common electrode layer disposed on the surface of the substrate 11. The conductive layer 33 can be an electrode layer of an entire blanket, or be patterned as a patterned conductive layer, not limited thereto. In addition, the conductive layer 33 is electrically connected to the electrode 13c through the through hole 23. Similarly, the through holes 23 can be formed in the substrate 11, and the other processes are then performed to complete the structure in FIG. 4B. The OLED 29O is disposed in the concave 25. Because the concave 25 accommodates most of the volume of the OLED 29o, the side-light from the light-emitting layer of the OLED 29O may face the conductive layer 27 and then be reflected by the conductive layer 27. The total light-emitting angle can be modified to be perpendicular to the bottom surface 1102 of the substrate by designing the pattern of the conductive layer 27 and the light-emitting angle of the reflected side-light. Therefore, the problem of mixing light of the adjacent OLEDs can be mitigated or eliminated. In addition, the TFT with the bottom gate structure in FIGS. 4A to 4B can be replaced by the TFT with the top gate structure in FIG. 2.

Figure 5A:
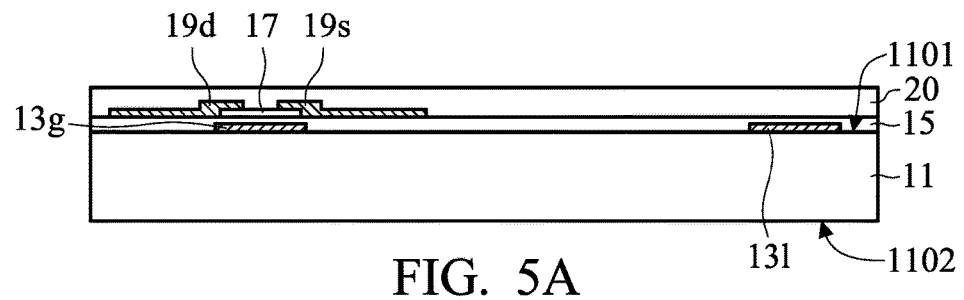
FIG. 5A to 5I show cross-sectional views of manufacturing a display device in one embodiment.

In the display devices and related manufactures of FIGS. 1A to 1H, 2, 3A to 3C, and 4A to 4B, the concave with the LED therein and the TFT are disposed at opposite sides of the substrate and connected by the through holes penetrating the substrate. However, the concave and the TFT can be disposed at the same side of the substrate. FIGS. 5A to 5I show cross-sectional views of manufacturing a display device in one embodiment. As shown in FIG. 5A, a conductive layer is formed on a substrate 11, and then patterned by lithography, etching, and the like to define a gate electrode 13g and a common electrode line 131 on the substrate 11. A gate insulation layer 15 is then formed on the gate electrode 13g, the common electrode line 131, and the substrate 11. A semiconductor layer 17 is then formed on the gate insulation layer 15 to correspond to the gate electrode 13g, and a source electrode 19s and a drain electrode 19d are formed to contact two respective sides of the semiconductor layer 17. A protection layer 20 is then formed on the source electrode 19s, the drain electrode 19d, the semiconductor layer 17, and the gate insulation layer 15.

Figure 5B:
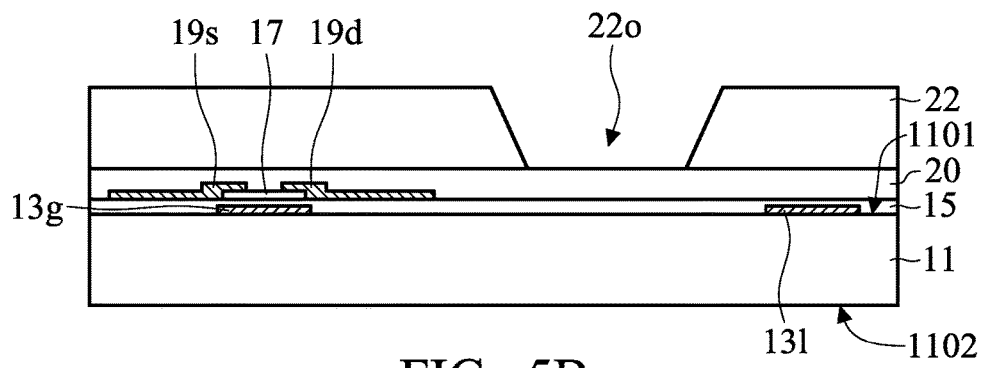
Figure 5C:
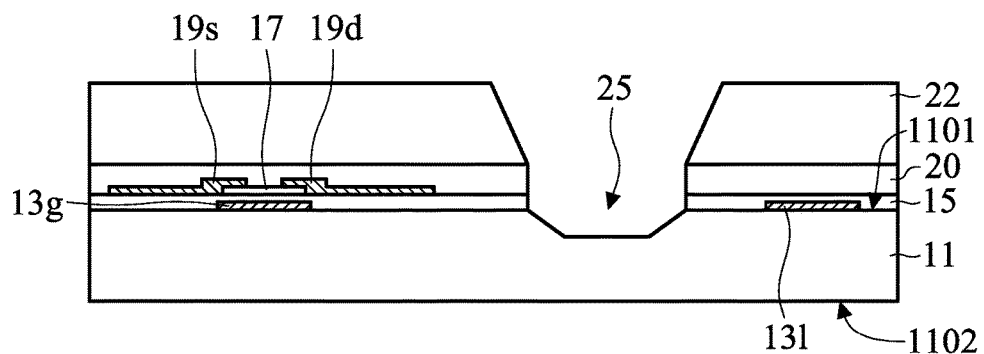

As shown in FIG. 5B, a photoresist 22 is then formed on the protection layer 20, and then patterned by lithography to define an opening 22o for exposing a part of the protection layer 20. As shown in FIG. 5C, an etching process is performed through the opening 22o of the photoresist 22 to remove parts of the protection layer 20, the gate insulation layer 15, and the substrate 11. As such, a concave 25 is formed in the substrate 11. As such, a part of the substrate 11 is recessed (removed). The surface of the recessed part doesn't belong to the top surface 1101 but belongs to the surface of the concave.

Figure 5D:
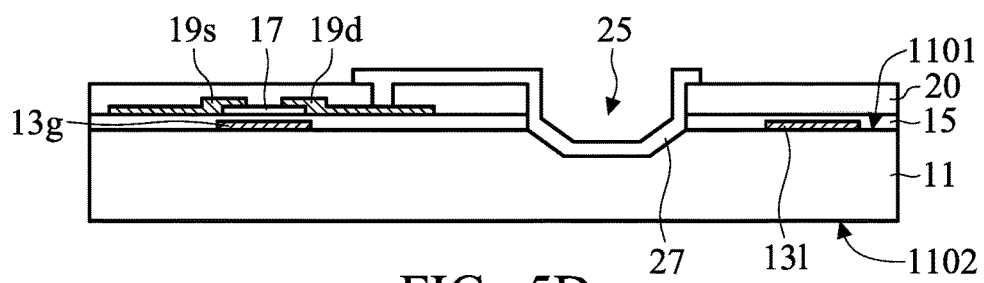

As shown in FIG. 5D, the photoresist 22 is removed, and a part of the protection layer 20 is removed by lithography, etching, and the like to form a via hole for exposing the drain electrode 19d. A conductor is then formed in the via hole (to electrically connect the drain electrode 19d), in the concave 25 and the opening of the protection layer 20 and the gate insulation layer 15, and on the protection layer 20. The conductor is then patterned by lithography, etching, and the like to define the conductive layer 27, as shown in FIG. 5D. The conductive layer 27 can be patterned to cover at least a portion of the surface of the concave.

Figure 5E:
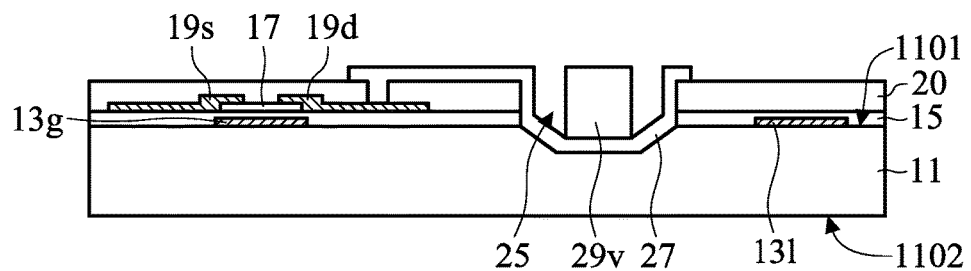

As shown in FIG. 5E, a LED 29v is electrically connected to the conductive layer 27 in the concave 25. In this embodiment, the opening of the protection layer 20 and the gate insulation layer 15 is combined with the concave 25 in the substrate 11 for accommodating the LED 29v. Therefore, the depth of the concave 25 in the substrate 11 of FIG. 5E will be less than the depth of the concave 25 in the substrate 11 of FIGS. 1A to 1H, 2, 3A to 3C, and 4A to 4B.

Figure 5F:
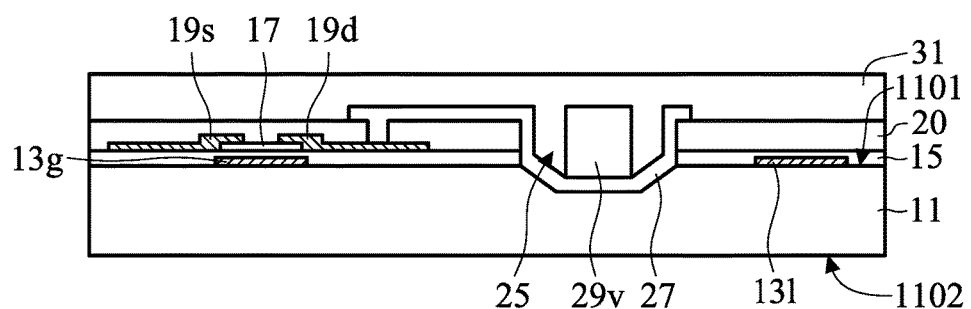
Figure 5G:
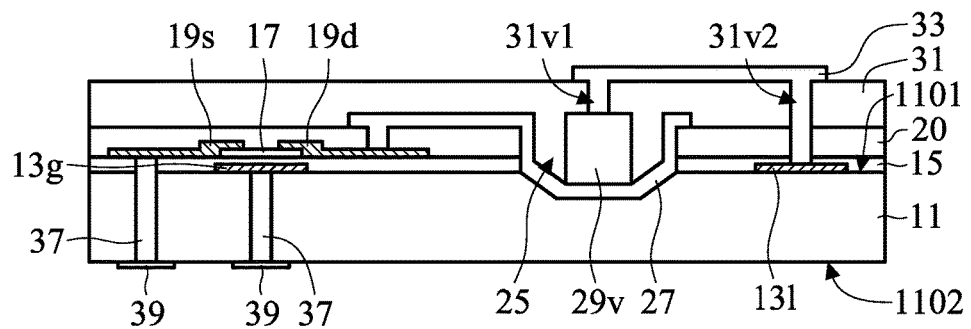

As shown in FIG. 5F, a protection layer 31 is disposed into the opening of the protection layer 20 and the gate insulation layer 15 and the concave 25 in the substrate 11. The protection layer 31 also is disposed on the conductive layer 27, the protection layer 20, and the LED 29v. As shown in FIG. 5G, via holes 31v1 and 31v2 are formed by lithography, etching, and the like to expose parts of the LED 29v and the common electrode line 131. A conductive layer 33 is then formed in the via holes 31v1 and 31v2 and on a surface of the protection layer 31, and then patterned by lithography, etching, and the like. In FIG. 5G, the drain electrode 19d connects to a bottom side of the LED 29v through the conductive layer 27, and the common electrode line 131 connects to a top side of the LED 29v through the conductive layer 33.

Figure 5H:
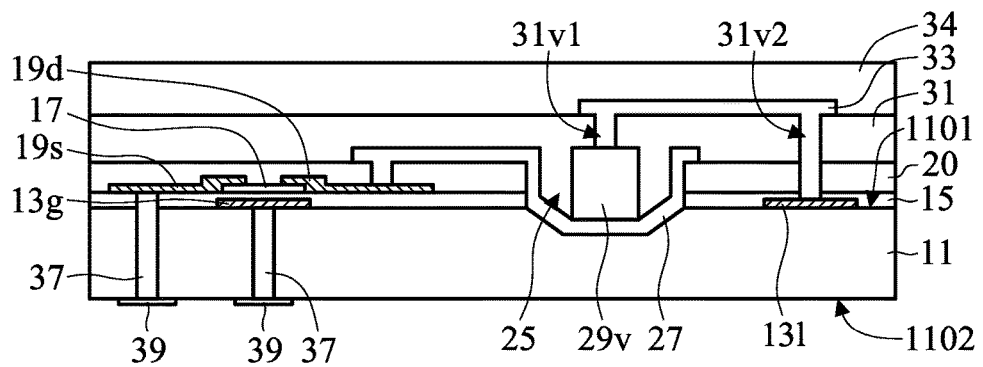
Figure 5I:
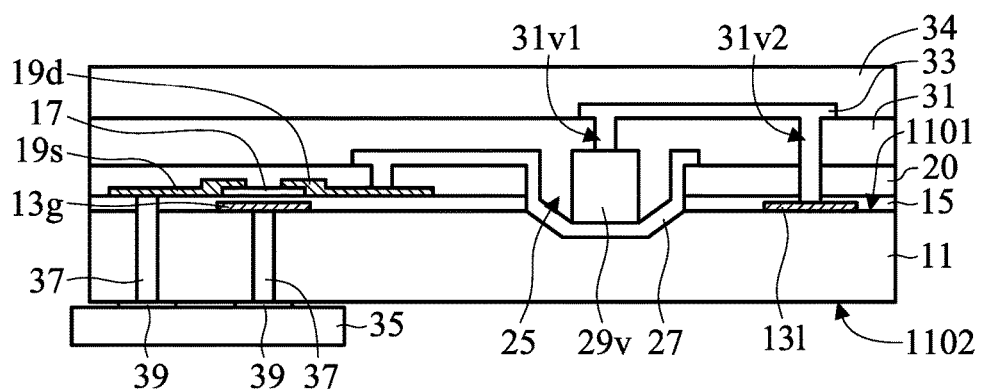

As shown in FIG. 5H, a protection layer 34 is formed to cover the conductive layer 33 and the protection layer 31. In one embodiment, the protection layer 34 can comprise organic material, inorganic material, organic-inorganic composite insulation material, or a stack structure thereof for protecting the display substrate. Through holes 37 are formed by lithography and etching or other suitable processes to penetrate the substrate 11 and the gate insulation layer 15, and the through holes 37 are respectively connected to the gate electrode 13g and the source electrode 19s. As shown in FIG. 5I, bonding pads 39 are then formed on the through holes 37. An external circuit 35 is then electrically connected to the bonding pads 39 for controlling and driving the LED 29v.

In this embodiment, the through holes 37 and the bonding pads 39 can be omitted, and the external circuit 35 on the top side of the substrate is electrically connected to the source electrode 19s and a part of the gate electrode 13g (not covering the semiconductor layer 17, the source electrode 19s, and the drain electrode 19d) through a through hole (not shown) penetrating the protection layer 34, the protection layer 31, and the protection layer 20. In this embodiment, the opening of the protection layer 20 and the gate insulation layer 15 and the concave 25 in the substrate may accommodate most of the volume of the LED. While the LED is appropriately confined in the opening and the concave 25, the problem of cracking or even breaking the device (due to subsequent processes applying non-uniform force on the device) can be mitigated. In another embodiment, the top surface of the LED 29v is substantially level with the top surface of the TFT region (e.g. the top surface of the conductive layer 27 on the protection layer 20). For example, a vertical distance difference between the top surface of the LED 29v and the top surface of the conductive layer 27 on the protection layer 20 is substantially less than 100 nm. As such, the problem of cracking or even breaking the device (due to subsequent processes applying non-uniform force on the device) can be mitigated. On the other hand, the opening and the concave 25 accommodates most of the volume of the LED 29v, so that the light-emitting layer of the LED is disposed in the concave 25, and the side-light from the light-emitting layer may face the conductive layer 27 and then be reflected by the conductive layer 27. The total light-emitting angle can be modified to be perpendicular to the bottom surface 1102 of the substrate by designing the pattern of the conductive layer 27 and the light-emitting angle of the reflected side-light. Therefore, the problem of mixing light of the adjacent LEDs can be mitigated or eliminated. In addition, the TFT with the bottom gate structure in FIGS. 5A to 5I can be replaced by the TFT with the top gate structure in FIG. 2.

Figure 6:
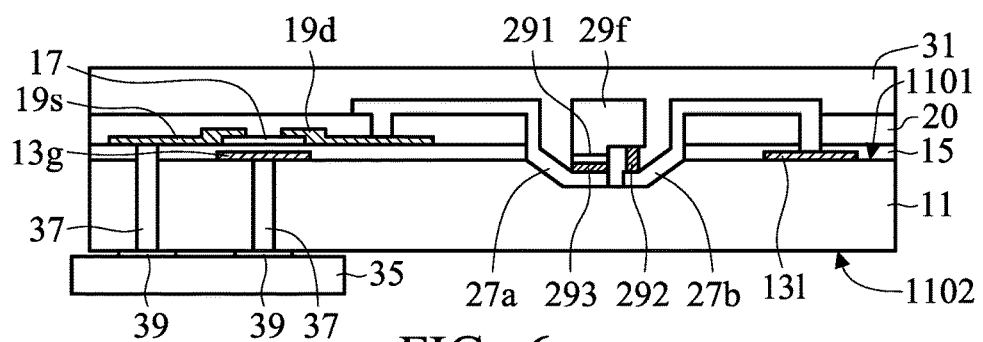
FIG. 6 shows a cross-sectional view of a display device.

The LED 29v in FIGS. 5A to 5I is the vertical-type LED, however, it can be replaced by a flip-chip type or other type LED. FIG. 6 shows a cross-sectional view of a display device in one embodiment. The LED 29f in FIG. 6 is a flip-chip type LED, meaning that the conductive layer 27 in FIG. 5D is separated into conductive layers 27a and 27b. The conductive layer 27a is connected to the drain electrode 19d through the via hole penetrating through the protection layer 20, and the conductive layer 27b is connected to the common electrode line 131 through the via hole penetrating the protection layer 20 and a part of the gate insulation layer 15. An anode contact and a cathode contact on the same side of a LED 29f are then respectively electrically connected to the conductive layers 27a and 27b. A protection layer 31 is disposed into the concave 25 of the substrate 11 and the opening of the protection layer 20 and the gate insulation layer 15 to cover the LED 29f, the conductive layers 27a and 27b, and the substrate 11. The other elements such as the through holes 37, the bonding pads 39, and the external circuit 35 are similar to those in the previous embodiment, and the related description is therefore omitted.

In another embodiment, the through holes 37 and the bonding pads 39 can be omitted, and the external circuit 35 on the top side of the substrate is electrically connected to the source electrode 19s and a part of the gate electrode 13g (not covering the semiconductor layer 17, the source electrode 19s, and the drain electrode 19d) through a through hole (not shown) penetrating the protection layer 31 and the protection layer 20. In this embodiment, the opening of the protection layer 20 and the gate insulation layer 15 and the concave 25 in the substrate may accommodate most of the volume of the LED. While the LED is appropriately confined in the opening and the concave 25, the problem of cracking or even breaking the device (due to subsequent processes applying non-uniform force on the device) can be mitigated. In another embodiment, the top surface of the LED 29v is substantially level with the top surface of the TFT region (e.g. the top surface of conductive layer 27 on the protection layer 20). For example, the top surface of the LED 29v and the top surface of conductive layer 27 on the protection layer 20 have a difference of less than 100 nm. As such, the problem of cracking or even breaking the device (due to subsequent processes applying non-uniform force on the device) can be mitigated. On the other hand, the opening and the concave 25 accommodates most of the volume of the LED 29f, so that the light-emitting layer of the LED is disposed in the concave 25, and the side-light from the light-emitting layer may face the conductive layer 27 and then be reflected by the conductive layer 27. The total light-emitting angle can be modified to be perpendicular to the bottom surface 1102 of the substrate by designing the pattern of the conductive layer 27 and the light-emitting angle of the reflected side-light. Therefore, the problem of mixing light of the adjacent LEDs can be mitigated or eliminated. In addition, the TFT with the bottom gate structure in FIG. 6 can be replaced by the TFT with the top gate structure in FIG. 2.

Figure 7A:
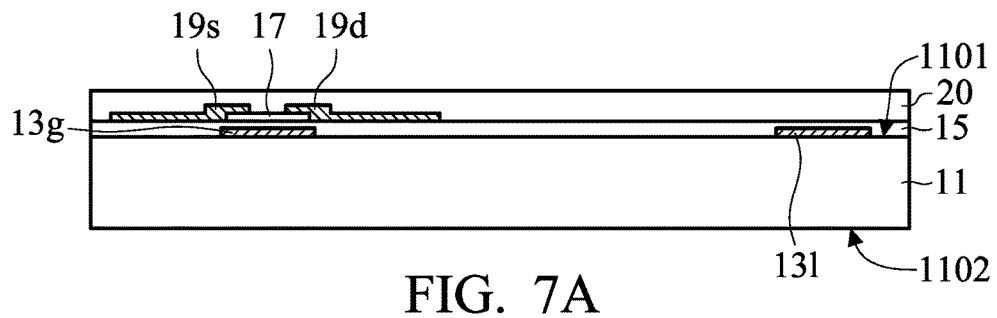
FIG. 7A to 7H show cross-sectional views of manufacturing a display device in one embodiment.

FIGS. 7A to 7H show cross-sectional views of manufacturing a display device in one embodiment. As shown in FIG. 7A, a conductive layer is formed on a substrate 11, and then patterned by lithography, etching, and the like to define a gate electrode 13g and a common electrode line 131 on the substrate 11. The conductive layer can comprise metal material, transparent conductive material, or another suitable conductive material. A gate insulation layer 15 is then formed on the gate electrode 13g, the common electrode line 131, and the substrate 11. A semiconductor layer 17 is then formed on the gate insulation layer 15 to correspond to the gate electrode 13g, and a source electrode 19s and a drain electrode 19d are formed to contact two respective sides of the semiconductor layer 17. A protection layer 20 is then formed on the source electrode 19s, the drain electrode 19d, the semiconductor layer 17, and the gate insulation layer 15.

Figure 7B:
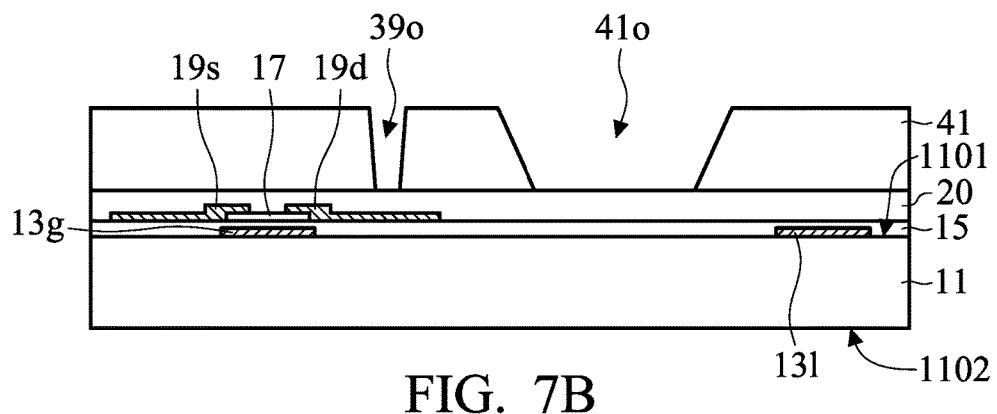
Figure 7C:
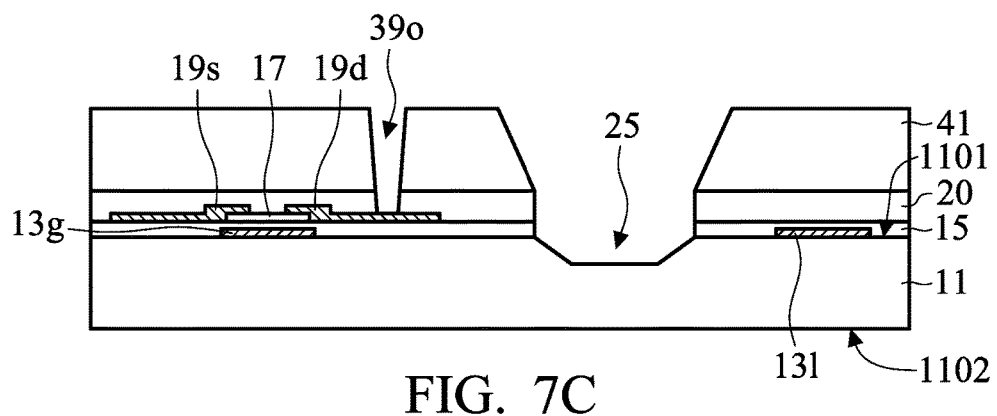

As shown in FIG. 7B, an insulation layer 41 is then formed on the protection layer 20, and then patterned by lithography, etching, and the like to define an opening 410 for exposing a part of the protection layer 20. In one embodiment, the insulation layer can comprise acrylic material or organic-inorganic composite insulation material. As shown in FIG. 7C, an etching process is performed through the opening 410 of the insulation layer 41 to remove parts of the protection layer 20, the gate insulation layer 15, and the substrate 11. As such, a via hole is formed to expose a part of the drain electrode 19d, and a concave 25 is formed in the substrate 11. As such, a part of the substrate 11 is recessed (removed). The surface of the recessed part doesn't belong to the top surface 1101 but belongs to the surface of the concave.

Figure 7D:
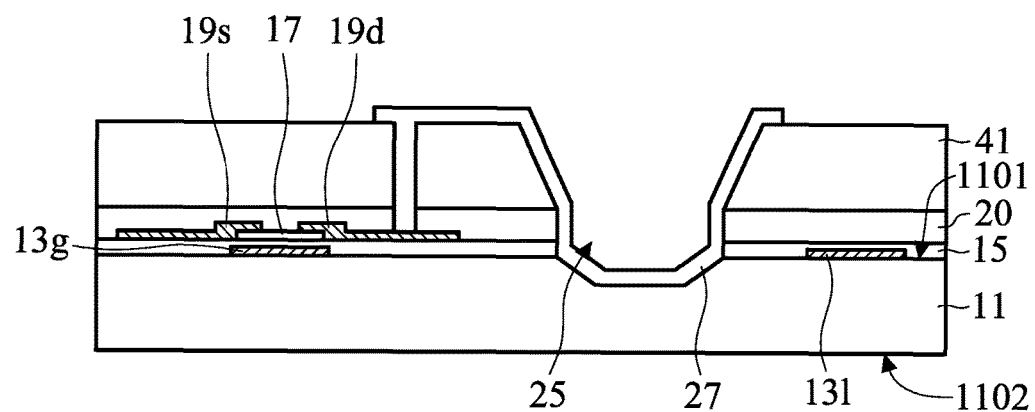

As shown in FIG. 7D, a conductor is disposed into the via hole, layered in the opening of the insulation layer 41, the protection layer 20, and the gate insulation layer 15 and the concave 25, and layered on the protection layer 20. The conductor is then patterned by lithography, etching, and the like to define the conductive layer 27.

Figure 7E:
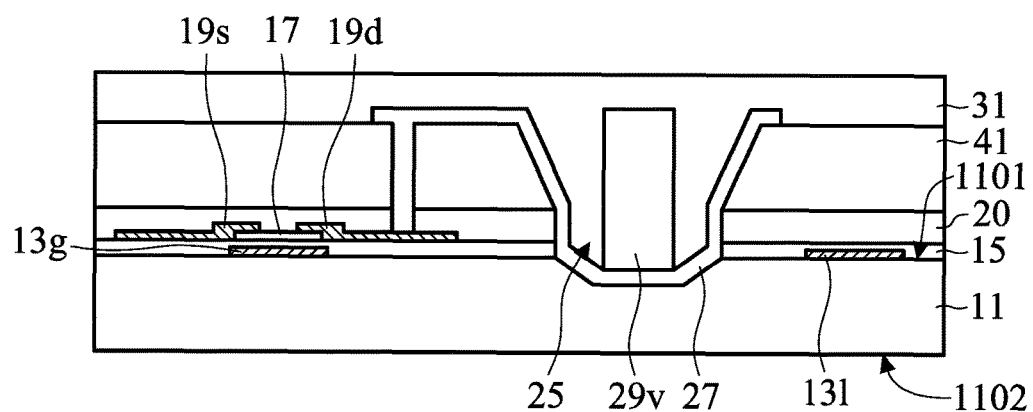

As shown in FIG. 7E, a LED 29v is electrically connected to the conductive layer 27 in the concave 25. In this embodiment, the opening of the insulation layer 41, the protection layer 20, and the gate insulation layer 15 is combined with the concave 25 in the substrate 11 for accommodating the LED 29v. Therefore, the depth of the concave 25 in the substrate 11 of FIG. 7E will be less than the depth of the concave 25 in the substrate 11 of FIGS. 1A to 1H, 2, 3A to 3C, and 4A to 4B. Compared to FIG. 5E, the depth of the concave 25 in FIG. 7E is shallower due to the additional insulation layer 41.

Figure 7F:
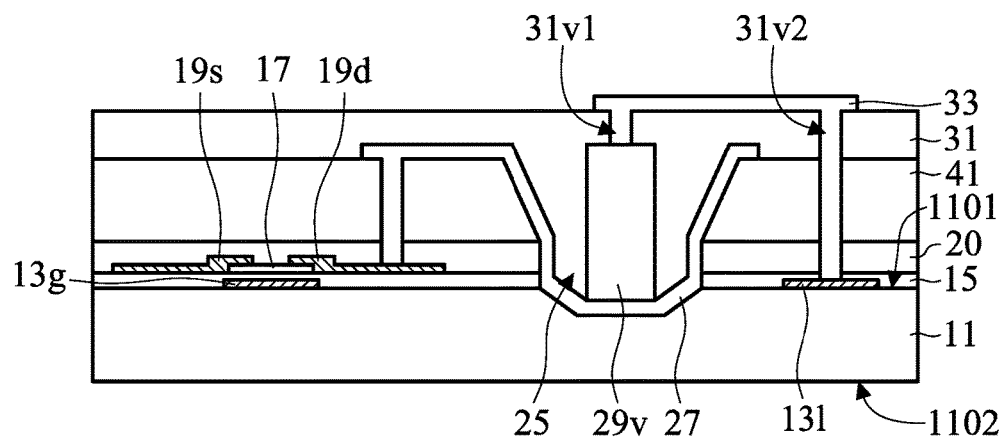

As shown in FIG. 7F, a protection layer 31 is disposed in the opening of the insulation layer 41, the protection layer 20, and the gate insulation layer 15 and the concave 25 of the substrate 11 to cover the conductive layer 27, the protection layer 20, and the LED 29v. As shown in FIG. 7F, via holes 31v1 and 31v2 are formed by lithography, etching, and the like to expose parts of the LED 29v and the common electrode line 131. A conductive layer 33 is then formed in the via holes 31v1 and 31v2 and on a surface of the protection layer 31, and then patterned by lithography, etching, and the like. In FIG. 7F, the drain electrode 19d is connected to the bottom side of the LED 29v through the conductive layer 27, and the common electrode line 131 is connected to the top side of the LED 29v through the conductive layer 33.

Figure 7G:
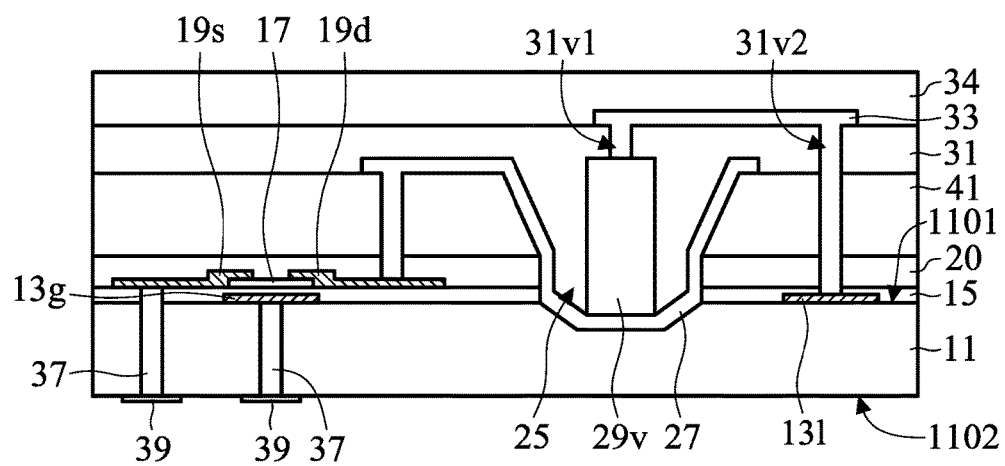
Figure 7H:
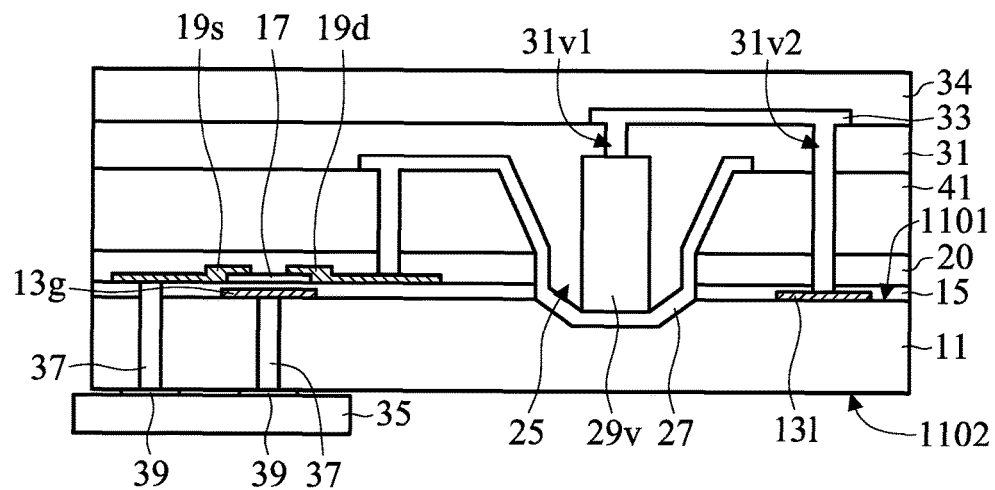

As shown in FIG. 7G, a protection layer 34 is formed to cover the conductive layer 33 and the protection layer 31. Through holes 37 are formed by lithography, etching, and the like to penetrate the substrate 11 and the gate insulation layer 15, and the through holes 37 are respectively connected to the gate electrode 13g and the source electrode 19s. As shown in FIG. 7H, bonding pads 39 are then formed on the through holes 37. An external circuit 35 is then electrically connected to the bonding pads 39 for controlling and driving the LED 29v.

In another embodiment, the through holes 37 and the bonding pads 39 can be omitted, and the external circuit 35 on the top side of the substrate is electrically connected to the source electrode 19s and a part of the gate electrode 13g (not covering the semiconductor layer 17, the source electrode 19s, and the drain electrode 19d) through a through hole (not shown) penetrating the protection layer 34, the protection layer 31, the insulation layer 41, and the protection layer 20. In this embodiment, the opening of the insulation layer 41, the protection layer 20, and the gate insulation layer 15 and the concave 25 of the substrate 11 may accommodate most of the volume of the LED. While the LED is appropriately confined in the opening and the concave 25, the problem of cracking or even breaking the device (due to subsequent processes applying non-uniform force on the device) can be mitigated. In one embodiment, the top surface of the LED 29v is substantially level with the top surface of the TFT region (e.g. the top surface of conductive layer 27 on the insulation layer 41). For example, a vertical distance difference between the top surface of the LED 29v and the top surface of conductive layer 27 on the protection layer 20 is substantially less than 100 nm. As such, the problem of cracking or even breaking the device (due to subsequent processes applying non-uniform force on the device) can be mitigated. On the other hand, the opening and the concave 25 accommodates most of the volume of the LED 29v, so that the light-emitting layer of the LED is disposed in the concave 25, and the side-light from the light-emitting layer may face the conductive layer 27 and then be reflected by the conductive layer 27. The total light-emitting angle can be modified to be perpendicular to the bottom surface 1102 of the substrate. Therefore, the problem of mixing light of the adjacent LEDs can be mitigated or eliminated. In addition, the TFT with the bottom gate structure in FIGS. 7A to 7H can be replaced by the TFT with the top gate structure in FIG. 2.

Figure 8:
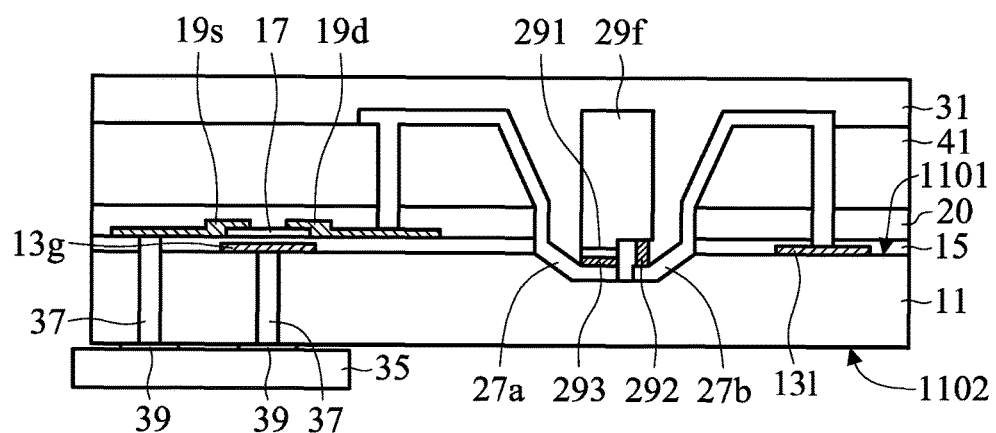
FIG. 8 shows a cross-sectional view of a display device.

The LED 29v in FIGS. 7A to 7H is a vertical-type LED, however, it can be replaced by a flip-chip type LED. FIG. 8 shows a cross-sectional view of a display device in one embodiment. The LED in FIG. 8 is a LED 29f, meaning that the conductive layer 27 in FIG. 7D is separated into conductive layers 27a and 27b. The conductive layer 27a is connected to the drain electrode 19d through the via hole penetrating through the insulation layer 41 and the protection layer 20, and the conductive layer 27b is connected to the common electrode line 131 through the via hole penetrating the insulation layer 41, the protection layer 20, and a part of the gate insulation layer 15. An anode contact and a cathode contact on the same side of a LED 29f are then respectively electrically connected to the conductive layers 27a and 27b. A protection layer 31 is disposed into the concave 25 of the substrate 11 and the opening of the insulation layer 41, the protection layer 20 and the gate insulation layer 15 to cover the LED 29f, the conductive layers 27a and 27b, and the substrate 11. The other elements such as the through holes 37, the bonding pads 39, and the external circuit 35 are similar to those in the previous embodiment, and the related description is therefore omitted.

In another embodiment, the through holes 37 and the bonding pads 39 can be omitted. The external circuit 35 on the top side of the substrate is electrically connected to the source electrode 19s through a through hole (not shown) penetrating the protection layer 31, the insulation layer 41, and the protection layer 20, and electrically connected to a part of the gate electrode 13g (not covering the semiconductor layer 17, the source electrode 19s, and the drain electrode 19d) through a through hole (not shown) penetrating the protection layer 31, the insulation layer 41, and the protection layer 20. In this embodiment, the opening of the insulation layer 41, the protection layer 20, and the gate insulation layer 15 and the concave 25 of the substrate 11 may accommodate most of the volume of the LED. While the LED is appropriately confined in the opening and the concave 25, the problem of cracking or even breaking the device (due to subsequent processes applying non-uniform force on the device) can be mitigated. In another embodiment, the top surface of the LED 29f is substantially level with the top surface of the TFT region (e.g. the top surface of conductive layer 27a on the insulation layer 41). For example, a vertical distance difference between the top surface of the LED 29f and the top surface of conductive layer 27 on the protection layer 20 is substantially less than 100 nm. As such, the problem of cracking or even breaking the device (due to subsequent processes applying non-uniform force on the device) can be mitigated. On the other hand, the light-emitting layer of the LED 29f is disposed in the concave 25, so that the problem of mixing light of the adjacent LEDs can be mitigated or eliminated. In addition, the TFT with the bottom gate structure in FIG. 8 can be replaced by the TFT with the top gate structure in FIG. 2.

While the disclosure has been described by way of examples, it is to be understood that the disclosure is not limited to the disclosed embodiments. On the contrary, it is intended to cover various modifications and similar arrangements (as would be apparent to those skilled in the art). The embodiments can be combined in any manner if necessary. Therefore, the scope of the appended claims should be accorded the broadest interpretation so as to encompass all such modifications and similar arrangements.

What is claimed is:

1. A display device, comprising:
   a substrate with a concave;
   a light-emitting diode disposed in the concave;
   a thin film transistor disposed on a surface of the substrate and electrically connected to the light-emitting diode; and
   a protection layer covering the light-emitting diode, wherein the protection layer comprises a via hole exposing a part of the light-emitting diode.

2. The display device as claimed in claim 1, wherein the thin film transistor and the light-emitting diode are disposed on the same side of the substrate.

3. The display device as claimed in claim 2, further comprising an organic layer covering the substrate.

4. The display device as claimed in claim 3, wherein the organic layer includes an opening corresponding to the concave of the substrate.

5. The display device as claimed in claim 1, wherein the thin film transistor and the light-emitting diode are disposed on different sides of the substrate, and the thin film transistor and the light-emitting diode are electrically connected by a through hole penetrating the substrate.

6. The display device as claimed in claim 1, further comprising a conductive layer covering the concave.

7. The display device as claimed in claim 6, wherein the conductive layer comprises a reflective material.

8. The display device as claimed in claim 6, wherein the conductive layer is electrically connected to a drain electrode of the thin film transistor.

9. The display device as claimed in claim 6, wherein the conductive layer is electrically connected to the light-emitting diode.

10. The display device as claimed in claim 6, wherein the conductive layer and a drain electrode of the thin film transistor are disposed on different sides of the substrate.

11. The display device as claimed in claim 6, wherein a part of the conductive layer is electrically connected to a drain electrode of the thin film transistor, and another part of the conductive layer is electrically connected to a common electrode line.

12. The display device as claimed in claim 1, wherein the thin film transistor comprises:
- a gate electrode;
- a semiconductor layer corresponding to the gate electrode;
- a gate insulation layer disposed between the gate electrode and the semiconductor layer; and
- a source electrode and a drain electrode respectively contacting the semiconductor layer,
- wherein the source electrode is electrically connected to an external circuit, and the drain electrode is electrically connected to the light-emitting diode.

13. The display device as claimed in claim 12, wherein the external circuit comprises a printed circuit board or an integrated circuit.

14. The display device as claimed in claim 12, wherein the external circuit and the light-emitting diode are disposed on different sides of the substrate.

15. The display device as claimed in claim 1, wherein the light-emitting diode comprises an inorganic light-emitting diode.

16. The display device as claimed in claim 15, wherein the inorganic light-emitting diode includes a flip-chip type inorganic light-emitting diode or a vertical type inorganic light-emitting diode.

17. A display device, comprising:
- a substrate with a concave;
- a light-emitting diode disposed in the concave; and
- a thin film transistor disposed on a surface of the substrate and electrically connected to the light-emitting diode,
- wherein a height of the light-emitting diode and a depth of the concave have a difference of less than 100 nm.

18. A display device, comprising:
- a substrate with a concave;
- a light-emitting diode disposed in the concave;
- a thin film transistor disposed on a surface of the substrate and electrically connected to the light-emitting diode, and
- a conductive layer covering the concave,
- wherein a vertical difference between a top surface of the light-emitting diode and a top surface of the conductive layer is less than 100 nm.

* * * * *